United States Patent
Myers et al.

(10) Patent No.: US 11,658,378 B2
(45) Date of Patent: May 23, 2023

(54) VERTICALLY TRANSITIONING BETWEEN SUBSTRATE INTEGRATED WAVEGUIDES (SIWS) WITHIN A MULTILAYERED PRINTED CIRCUIT BOARD (PCB)

(71) Applicant: International Business Machines Corporation, Armonk, NY (US)

(72) Inventors: Joshua C. Myers, Austin, TX (US); Jose A. Hejase, Austin, TX (US); Junyan Tang, Austin, TX (US); Pavel Roy Paladhi, Austin, TX (US); Wiren D. Becker, Hyde Park, NY (US); Sungjun Chun, Austin, TX (US); Daniel M. Dreps, Georgetown, TX (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 503 days.

(21) Appl. No.: 16/600,760

(22) Filed: Oct. 14, 2019

(65) Prior Publication Data
US 2021/0111472 A1    Apr. 15, 2021

(51) Int. Cl.
*H01P 5/02* (2006.01)
*H01P 3/12* (2006.01)
(Continued)

(52) U.S. Cl.
CPC .............. *H01P 5/024* (2013.01); *H01P 3/121* (2013.01); *H05K 1/0215* (2013.01);
(Continued)

(58) Field of Classification Search
CPC ................................ H01P 3/121; H01P 5/024
(Continued)

(56) References Cited

U.S. PATENT DOCUMENTS

| 4,716,386 A | 12/1987 | It |
| 5,539,361 A | 7/1996 | Davidovitz |

(Continued)

FOREIGN PATENT DOCUMENTS

| CN | 107968261 A | 4/2018 |
| CN | 108832245 A | 11/2018 |

(Continued)

OTHER PUBLICATIONS

Paladhi et al., *Dual-band Monopole Antenna Feeds for Substrate Integrated Waveguides*, 2018 IEEE $27^{th}$ Conference on Electrical Performance of Electronic Packaging and Systems (EPEPS), IEEE, DOI: 10.1109/EPEPS.2018.8534265, Date of Conference: Oct. 14-17, 2018, Date Added to IEEEXplore: Nov. 15, 2018.

(Continued)

*Primary Examiner* — Benny T Lee
(74) *Attorney, Agent, or Firm* — Nathan M. Rau

(57) ABSTRACT

Methods and apparatuses for vertically transitioning signals between substrate integrated waveguides within a multilayered printed circuit board (PCB) are disclosed. A first substrate integrated waveguide (SIW) is provided in a first layer of the PCB, the first SIW having a first terminal portion. A second SIW is provided in a second layer of the PCB, the second SIW having a second terminal portion that overlaps with the first terminal portion, wherein a first ground plane separates the first SIW and the second SIW. A vertical transition comprising an aperture in the first ground plane that is disposed in an area defined by the overlap of the first terminal portion and the second terminal portion, such that a signal propagated in the first SIW transitions to the second SIW in a different layer through the aperture.

14 Claims, 10 Drawing Sheets

(51) Int. Cl.
*H05K 1/11* (2006.01)
*H05K 1/02* (2006.01)

(52) U.S. Cl.
CPC .......... *H05K 1/0246* (2013.01); *H05K 1/116* (2013.01); *H05K 2201/037* (2013.01)

(58) Field of Classification Search
USPC ...................................................... 333/24 R
See application file for complete search history.

(56) References Cited

U.S. PATENT DOCUMENTS

| | | | |
|---|---|---|---|
| 6,359,590 B2* | 3/2002 | Takenoshita | H01Q 21/0068 343/785 |
| 6,515,562 B1* | 2/2003 | Takenoshita et al. | H01P 3/121 333/248 |
| 7,079,079 B2 | 7/2006 | Jo et al. | |
| 7,205,862 B2 | 4/2007 | Tahara et al. | |
| 8,576,023 B1 | 11/2013 | Buckley et al. | |
| 8,598,961 B2 | 12/2013 | Hasselblad et al. | |
| 9,531,052 B2 | 12/2016 | Dang et al. | |
| 10,141,623 B2 | 11/2018 | Connor et al. | |
| 10,665,917 B2 | 5/2020 | Frank et al. | |
| 2017/0346169 A1 | 11/2017 | Wang et al. | |
| 2018/0248241 A1 | 8/2018 | Frank et al. | |
| 2019/0057945 A1 | 2/2019 | Maaskant et al. | |
| 2020/0059010 A1 | 2/2020 | Yang et al. | |
| 2020/0067178 A1 | 2/2020 | Hu et al. | |
| 2021/0210857 A1 | 7/2021 | Sayama et al. | |

FOREIGN PATENT DOCUMENTS

| | | |
|---|---|---|
| CN | 109273832 A | 1/2019 |
| GB | 2497982 B | 4/2014 |
| IN | 201631001532 A | 12/2017 |

OTHER PUBLICATIONS

U.S. Appl. No. 16/600,795, to Pavel Roy Paladhi et al., entitled, *PCB With Substrate Integrated Waveguides Using Multi-Band Monopole Antenna Feeds For High Speed Communication*, assigned to International Business Machines Corporation, 28 pages, filed Oct. 14, 2019.

P201810019US01, Appendix P; List of IBM Patent or Applications Treated as Related, Oct. 14, 2019, 2 pages.

Meyers et al., *Vertical and Horizontal Transitions of Substrate Integrated Waveguides Within a Multi-Layered PCB for High Speed Signaling Applications*, IEEE 27th Conference on Electrical Performance of Electronic Packaging and Systems (EPEPS), Nov. 2018, 3 pages, IEEE Xplore digital Library online (IEEE.org), DOI: 10.1109/EPEPS.2018.8534285.

\* cited by examiner provide a first substrate integrated waveguide (SIW) implemented in a first layer of the PCB, the first SIW having a first terminal portion, and providing a second SIW implemented in a second layer of the PCB, the second SIW having a second terminal portion that overlaps with the first terminal portion, wherein a first ground plane separates the first SIW and the second SIW
810

provide a vertical transition comprising an aperture in the first ground plane that is disposed in an area defined by the overlap of the first terminal portion and the second terminal portion
820

propagate a signal in the first SIW
830

receive the signal in the second SIW through the aperture
840

FIG. 8

VERTICALLY TRANSITIONING BETWEEN SUBSTRATE INTEGRATED WAVEGUIDES (SIWS) WITHIN A MULTILAYERED PRINTED CIRCUIT BOARD (PCB)

BACKGROUND

Field of the Invention

The field of the invention is high speed signaling, or, more specifically, methods, apparatus, and products for vertically transitioning signals between substrate integrated waveguides (SIWs) within a multilayered printed circuit board (PCB).

Description of Related Art

The development of the EDVAC (Electronic Discrete Variable Automatic Computer) computer system of 1948 is often cited as the beginning of the computer era. Since that time, computer systems have evolved into extremely complicated devices. Today's computers are much more sophisticated than early systems such as the EDVAC. Computer systems typically include a combination of hardware and software components, application programs, operating systems, processors, buses, memory, input/output devices, and so on. As advances in semiconductor processing and computer architecture push the performance of the computer higher and higher, more sophisticated computer software has evolved to take advantage of the higher performance of the hardware, resulting in computer systems today that are much more powerful than just a few years ago.

Recently, there has been a need to increase the bandwidth of current waveguiding technologies in standard printed circuit boards (PCBs). This has become a complex problem to solve, as traditional waveguiding structures, such as striplines and microstrip lines, exhibit high transmission losses at operational frequencies exceeding 50 GHz due to copper losses associated with their construction. Therefore, there has been an increased effort to develop high frequency waveguides that do not exhibit such losses.

A number of alternative high frequency waveguides have been introduced. For example, Terahertz (100+ GHz) radiation has been coupled through scattering onto cylindrical wires which support low order radial mode propagation. Hollow cylindrical metallic waveguides with thin inner dielectric coatings have also been studied for THz wave propagation, with the dielectric coating chosen to be much smaller than a wavelength. More exotic solutions, such as photonic bandgap (PBG) structures, have also been studied, where the transmission and rejection of high frequency pulses are observed in a parallel plate photonic structure. In addition, hollow core electronic band gap (EBG) waveguides made of dielectric structures have been investigated for THz propagation. Quasi-optical approaches which can efficiently couple freely propagating THz radiation into metallic rectangular and cylindrical waveguides have also been introduced. While many of these proposed waveguides have been shown to transmit high frequency radiation, most are either inefficient compared with traditional RF methods, are difficult to implement in current PCB technology or can experience considerable crosstalk when placed in close proximity to each other.

SUMMARY

An embodiment in accordance with the present invention is directed to an apparatus configured for vertically transitioning signals between substrate integrated waveguides within a multilayered printed circuit board (PCB), comprising a first substrate integrated waveguide (SIW) implemented in a first layer of the PCB, the first SIW having a first terminal portion, a second SIW implemented in a second layer of the PCB, the second SIW having a second terminal portion that overlaps with the first terminal portion, a first ground plane separating the first SIW and the second SIW, and a vertical transition comprising an aperture the first ground plane that is disposed an area defined by the overlap of the first terminal portion and the second terminal portion.

Another embodiment is directed to a method of vertically transitioning a signal between substrate integrated waveguides within a multilayered PCB, comprising providing a first substrate integrated waveguide (SIW) implemented in a first layer of the PCB, the first SIW having a first terminal portion, and providing a second SIW implemented in a second layer of the PCB, the second SIW having a second terminal portion that overlaps with the first terminal portion, wherein a first ground plane separates the first SIW and the second SIW, providing a vertical transition comprising an aperture in the first ground plane that is disposed in an area defined by the overlap of the first terminal portion and the second terminal portion, propagating a signal in the first SIW, and receiving the signal in the second SIW through the aperture.

In various embodiments, the first SIW may comprise, disposed between the first ground plane and a second ground plane, a first dielectric layer, first side walls of periodic vias connecting the first ground plane and the second ground plane, and a first end wall of periodic vias, connecting the first ground plane and the second ground plane, disposed perpendicular to and between the first side walls at the first terminal portion. Similarly, the second SIW may include, disposed between the first ground plane and a third ground plane a second dielectric layer, second side walls of periodic vias connecting the first ground plane and the third ground plane, and a second end wall of periodic vias, connecting the first ground plane and the third ground plane, disposed perpendicular to and between the second side walls at the second terminal portion. Furthermore, the first end wall of periodic vias and the second end wall of periodic vias at least partially define the overlap of the first terminal portion and the second terminal portion such that the aperture in the first ground plane is formed between connection points of the first end wall of periodic vias and the second end wall of periodic vias to the first ground plane.

In various embodiments, the first SIW may include a first set of ground vias crossing the waveguide after the aperture in the direction of signal transmission and the second SIW may include a second set of ground vias crossing the waveguide before the aperture in the direction of signal transmission, such that the first set of ground vias and the second set of ground vias guide a signal through the aperture from the first layer to the second layer.

In some embodiments, the first layer of the PCB and the second layer of the PCB are separated by one or more additional layers including at least second ground plane having an aperture corresponding to the aperture of the first ground plane, and wherein the first set of ground vias extends from a bottom ground plane of the first SIW to the second ground plane, and wherein the second set of vias extend from the first ground plane to a top ground plane of the second SIW.

In various embodiments, a width of the aperture is equal to a width of the waveguide of the first SIW and the second SIW, and a length of the aperture is determined based on operational frequency, substrate material characteristics, and a thickness of the first ground plane.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

BRIEF DESCRIPTION OF THE DRAWINGS

FIG. 8 is flowchart of a method for vertically transitioning signals between SIWs in accordance with the present invention.

DETAILED DESCRIPTION

A substrate integrated waveguide (SIW) is one solution to high-speed signaling due to its low loss and low crosstalk properties. A SIW is a rectangular waveguide-like structure implementable within a printed circuit board (PCB) dielectric layer in which the side walls are composed of tightly pitched, significantly less than a wavelength, periodic vias. This waveguide is sandwiched between the top and bottom ground planes of the PCB dielectric layer. While this configuration has been studied extensively, the implementation of SIWs into commercial products has not been thoroughly examined. In particular, the potential of replacing stripline technology within high-speed (100+ Gb/s) buses in a multi-layered PCB due to expected lower levels of attenuation that can be achieved. In order to replace these existing technologies, SIWs must be functionally similar, including being able to transition signals within the PCB, such as layer-to-layer connections (vertical transitions).

In a traditional PCB, striplines are connected for vertical layer-to-layer transitions using vias; however, since there is no direct metallic transmission line being used to transmit a signal in a SIW, vias are not required to carry the signal. In embodiments according to the present invention, two SIWs are positioned in different layers of the PCB. A small rectangular opening is placed in the ground plane between the waveguide with a width W and a length L. The width, W, is identical to the width of the straight waveguide section in each layer. Ground vias are also placed at the end of the first waveguide in the bottom layer on one side of the opening, and on the opposite side of the opening on the second layer. The opening and the ground vias direct wave propagation between the SIWs on both layers. The length, L, of the opening is varied according to requirements of the design, operational frequency, substrate properties, and PCB dimensions, as will be described below.

Figure 1A:
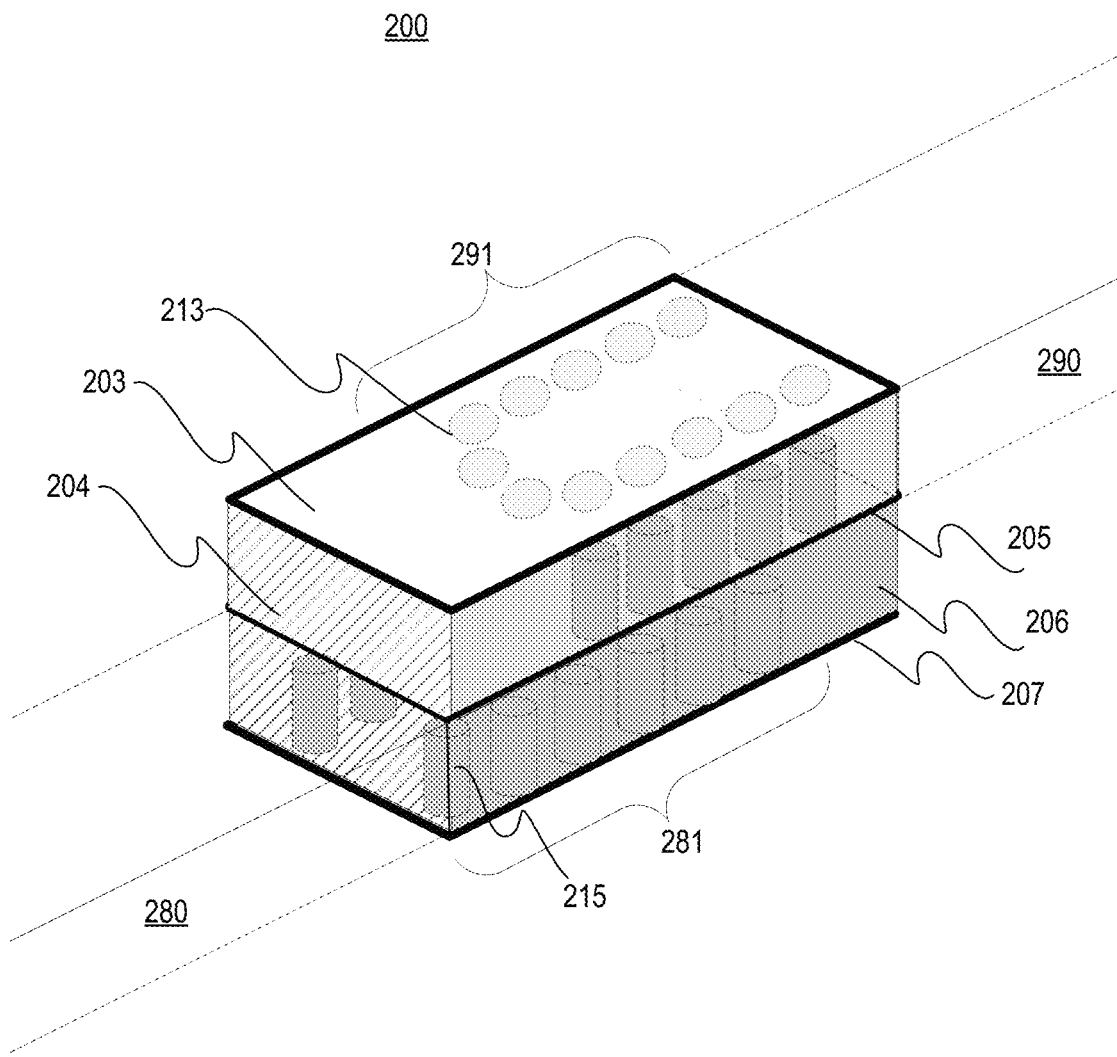
FIG. 1A shows a diagram of a PCB configured for vertically transitioning signals between SIWs in accordance with the present invention.

Exemplary methods, apparatus, and products for vertically transitioning signals between SIWs within a multilayered PCB in accordance with the present invention are described with reference to the accompanying drawings, beginning with FIG. 1A. FIG. 1A sets forth a diagram of an exemplary multilayered PCB configured for vertically transitioning signals between SIWs within a multilayered PCB according to embodiments of the present invention. The perspective partial view of the multilayered PCB of FIGS. 1A, 1B, and 1C includes a first SIW (281) implemented in a first layer (280) of the PCB (200) and a second SIW (291) implemented in a second layer (290) of PCB of FIG. 1C, such that the first SIW and the second SIW share a conductive ground plane (205). The PCB of FIGS. 1A, 1B, and 1C also includes a top ground plane (203), a bottom ground plane (207), vias (215) within the first SIW (281), and vias (213) within the second SIW (291).

In FIG. 1A, the first SIW further includes a dielectric substrate (206) and ground vias (215) arranged through the substrate in two tightly-pitched parallel rows. The vias (215) connect the ground plane (205) to a bottom conductive ground plane (207), between which the dielectric substrate (206) is sandwiched. The vias represented by dashed lines indicate where the vias (215) appear in the dielectric substrate (206); however, for clarity not all vias are depicted. Together, the ground vias (215), ground plane (205), and bottom ground plane (207) create a waveguide channel to guide a signal that is propagated in the dielectric substrate (206).

In FIG. 1A, the second SIW further includes a dielectric substrate (204) and ground vias (213) arranged through the substrate in two tightly-pitched parallel rows. The vias (213) connect the ground plane (205) to a top conductive ground plane (203), between which the dielectric substrate (204) is sandwiched. The vias represented by dashed lines indicate where the vias (213) appear in the dielectric substrate (204); however, for clarity not all vias are depicted. Together, the ground vias (213), ground plane (205), and top ground plane (203) create a waveguide channel to guide a signal that is propagated in the dielectric substrate (204). Together, the ground vias (213), ground plane (205), and ground plane (203) create a waveguide channel to guide a signal that is propagated in the dielectric substrate (204).

In FIG. 1A, only the overlapping terminating portions of the first SIW and the second SIW are shown, with dashed lines indicating that the remaining portion of each of the first SIW and the second SIW extend in opposite directions. The overlapping terminating portions of the first SIW and second SIW are illustrated because a vertical transition from first layer (280) of the PCB to the second layer (290) of the PCB may be made at the overlap through an opening in the ground plane (205).

Figure 1B:
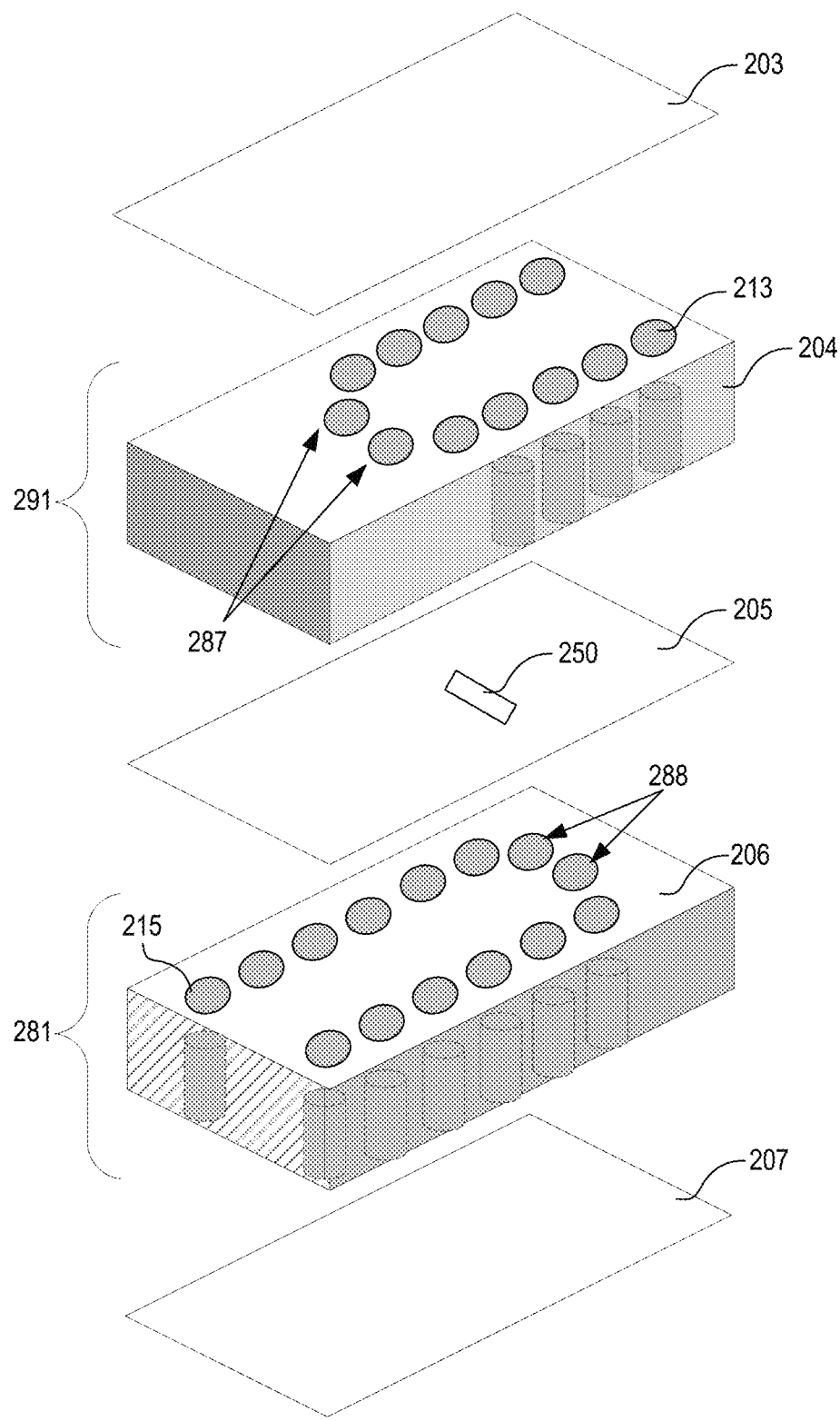
FIG. 1B shows an exploded view of a PCB for vertically transitioning signals between SIWs in accordance with the present invention.

For further explanation, FIG. 1B sets forth an exploded view of the PCB shown in FIG. 1A, wherein reference identifier commonality is maintained. As can be seen in FIG. 1B, a window (250) is formed in the ground plane (205) at an area where the vias (215) of the first SIW (281) and the vias (213) of the second SIW (291) overlap. An end wall of vias (288), disposed perpendicular to and between the parallel rows of vias (215), is placed at the end of the parallel rows of vias (215) creating a signal propagation boundary of the first SIW (281). The window (250) in the ground plane (205) is disposed proximate the end wall of vias (288). Another end wall of vias (287), disposed perpendicular to and between the parallel rows of vias (213), is placed at the end of the parallel rows of vias (213) creating a signal propagation boundary of the second SIW (291). The window (250) in the ground plane (205) is disposed proximate the end wall of vias (287). In other words, the window (250) of the ground plane (205) is disposed in an overlapping area of the first and second SIWs (281, 291) defined, in part, by the signal propagation boundary of the first SIW (281) and the signal propagation boundary of the second SIW (291).

Figure 1C:
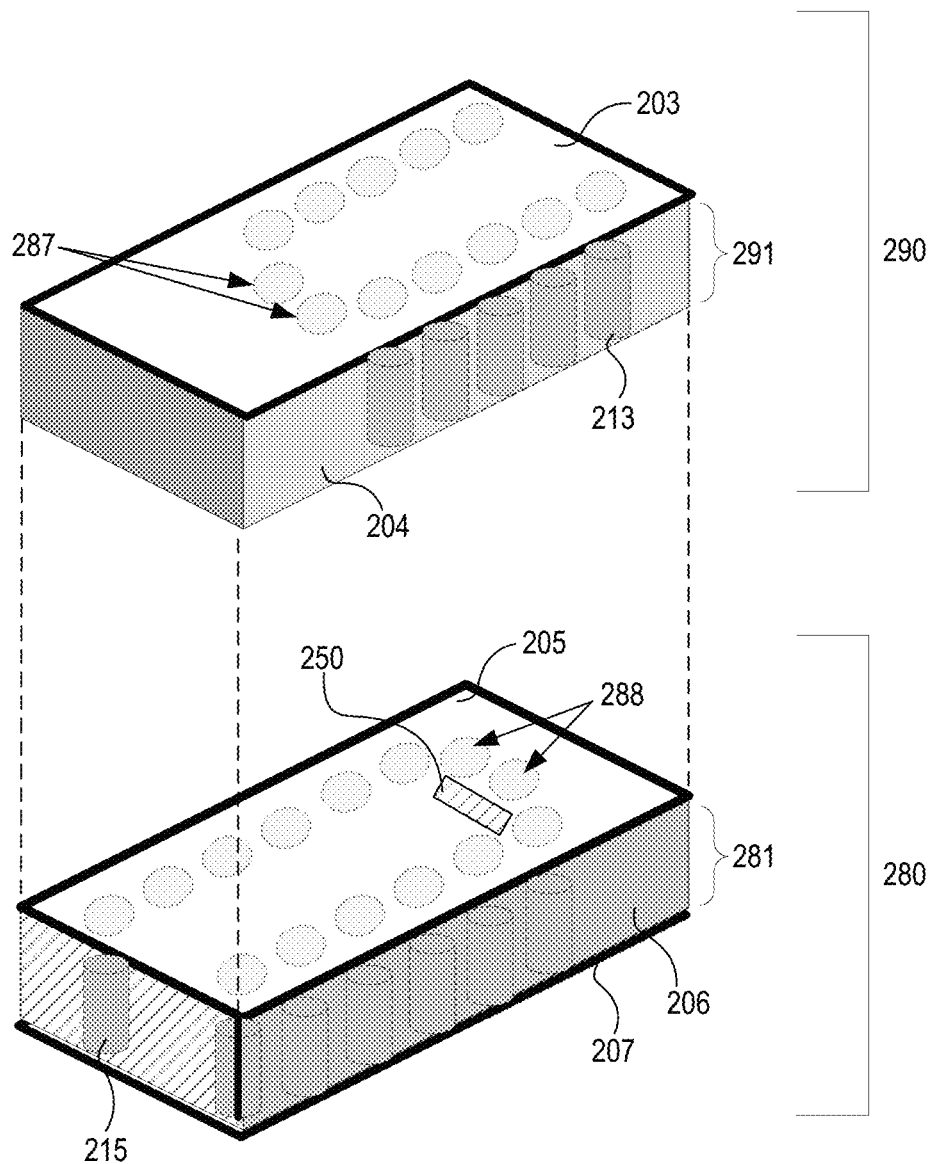
FIG. 1C shows a diagram of a PCB configured for vertically transitioning signals between SIWs in accordance with the present invention.

For further explanation, FIG. 1C sets forth a partially exploded view of the PCB shown in FIG. 1A, wherein reference identifier commonality is maintained. As can be seen in FIG. 1C, the first SIW (281) is sandwiched between the ground plane (205) and the bottom ground plane (207). In FIG. 1C, the window (250) is disposed in the ground plane (205) in an area where the first SIW (281) and the second SIW (291) overlap, such that a signal traveling through the dielectric substrate (206) in the first layer (280) is guided through the window (250) into the dielectric substrate (204) of the second layer (290) by the end wall vias (288) in the first layer (280) and end wall vias (287) in the second layer (290) that effectively frame the window (250).

Vertically transitioning signals between SIWs within a multilayered PCB in accordance with the present invention is generally implemented in computers, that is, with automated computing machinery. In the system of FIGS. 1A, 1B and 1C, for example, the multilayer PCB may be implemented as part of a high-speed bus in a computer. Further, vertically transitioning signals between SIWs within a multilayered PCB in accordance with the present invention may be carried out using computer aided design (CAD). For further explanation, therefore, FIG. 2 sets forth a block diagram of automated computing machinery comprising an exemplary computer (152) configured for vertically transitioning signals between SIWs within a multilayered PCB according to embodiments of the present invention. The computer (152) of FIG. 2 includes at least one computer processor (156) or 'CPU' as well as random access memory (168) (RAM') which is connected through a high speed memory bus (166) and bus adapter (158) to processor (156) and to other components of the computer (152). The computer (152) of FIG. 2 includes high-speed non-volatile memory such as flash memory (134) which may utilize a high-speed signaling bus configured with vertically transitioned SIWs in accordance with the present invention.

Stored in RAM (168) is a PCB design application (126), a module of computer program instructions for designing PCB layouts, including the design and simulation of vertical transitioning between SIWs within a multilayered PCB that are in accordance with embodiments of the present invention. For example, PCB design application (126) may be CAD software.

Also stored in RAM (168) is an operating system (154). Operating systems useful in computers configured for vertically transitioning signals between SIWs within a multilayered PCB according to embodiments of the present invention include UNIX™, Linux™, Microsoft XP™, AIX™, IBM's i5/OS™, and others as will occur to those of skill in the art. The operating system (154) and PCB design application (126) in the example of FIG. 2 are shown in RAM (168), but many components of such software typically are stored in non-volatile memory also, such as, for example, on data storage (170) such as a disk drive.

Figure 2:
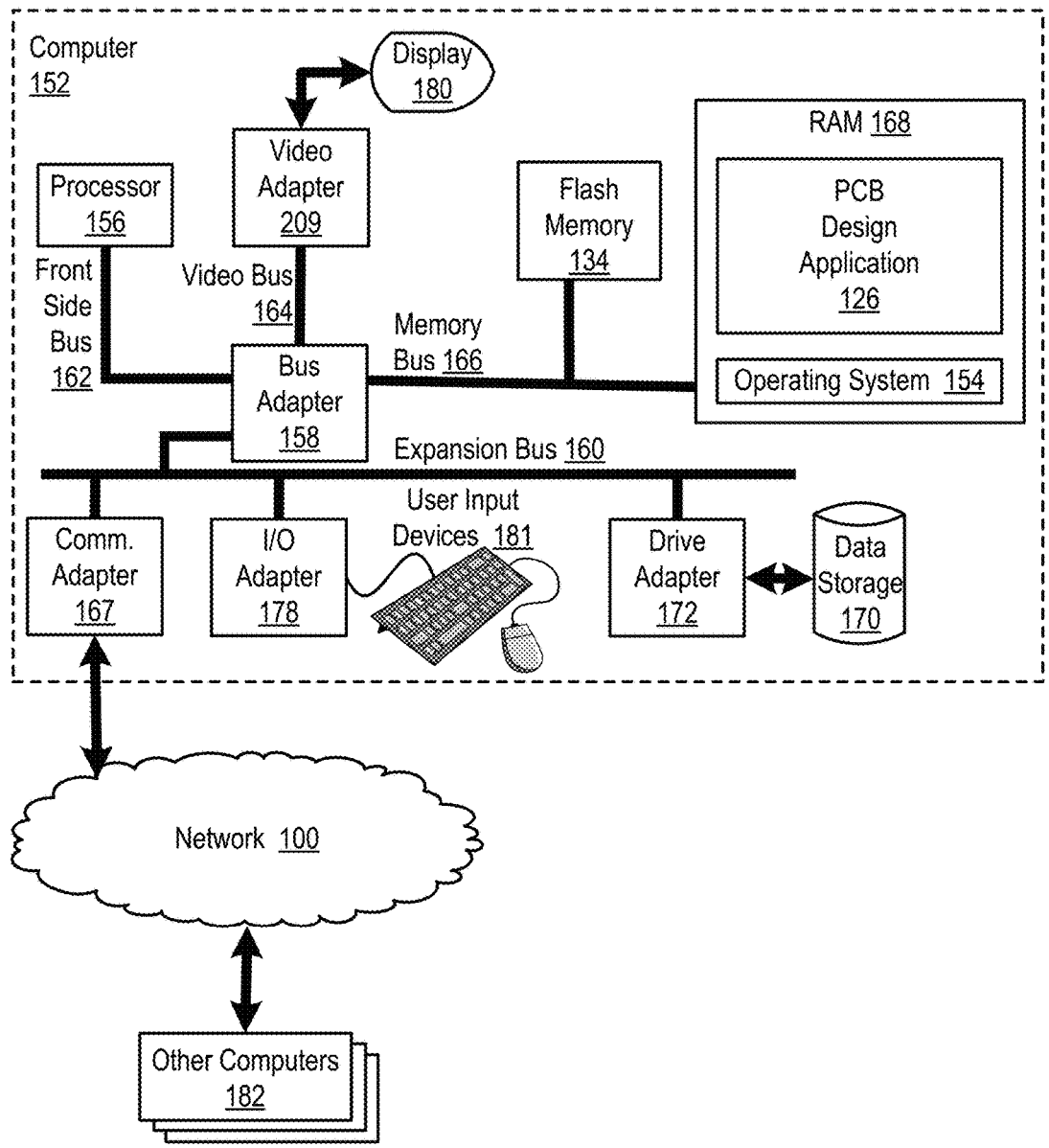
FIG. 2 shows an exemplary computer system configured for vertically transitioning signals between SIWs in accordance with the present invention.

The computer (152) of FIG. 2 includes disk drive adapter (172) coupled through expansion bus (160) and bus adapter (158) to processor (156) and other components of the computer (152). Disk drive adapter (172) connects non-volatile data storage to the computer (152) in the form of data storage (170). Disk drive adapters useful in computers configured for vertically transitioning signals between SIWs within a multilayered PCB according to embodiments of the present invention include Integrated Drive Electronics ('IDE') adapters, Small Computer System Interface ('SCSI') adapters, and others as will occur to those of skill in the art. Non-volatile computer memory also may be implemented for as an optical disk drive, electrically erasable programmable read-only memory (so-called 'EEPROM' or 'Flash' memory), RAM drives, and so on, as will occur to those of skill in the art.

The example computer (152) of FIG. 2 includes one or more input/output ('I/O') adapters (178). I/O adapters implement user-oriented input/output through, for example, software drivers and computer hardware for controlling output to display devices such as computer display screens, as well as user input from user input devices (181) such as keyboards and mice. The example computer (152) of FIG. 2 includes a video adapter (209), which is an example of an I/O adapter specially designed for graphic output to a display device (180) such as a display screen or computer monitor. Video adapter (209) is connected to processor (156) through a high speed video bus (164), bus adapter (158), and the front side bus (162), which is also a high speed bus.

The exemplary computer (152) of FIG. 2 includes a communications (i.e. Comm) adapter (167) for data communications with other computers (182) and for data communications with a data communications network (100). Such data communications may be carried out serially through RS-232 connections, through external buses such as a Universal Serial Bus ('USB'), through data communications networks such as IP data communications networks, and in other ways as will occur to those of skill in the art. Communications adapters implement the hardware level of data communications through which one computer sends data communications to another computer, directly or through a data communications network. Examples of communications adapters useful in computers configured for vertically transitioning signals between SIWs within a multilayered PCB according to embodiments of the present invention include modems for wired dial-up communications, Ethernet (IEEE 802.3) adapters for wired data communications, and 802.11 adapters for wireless data communications.

Figure 3:
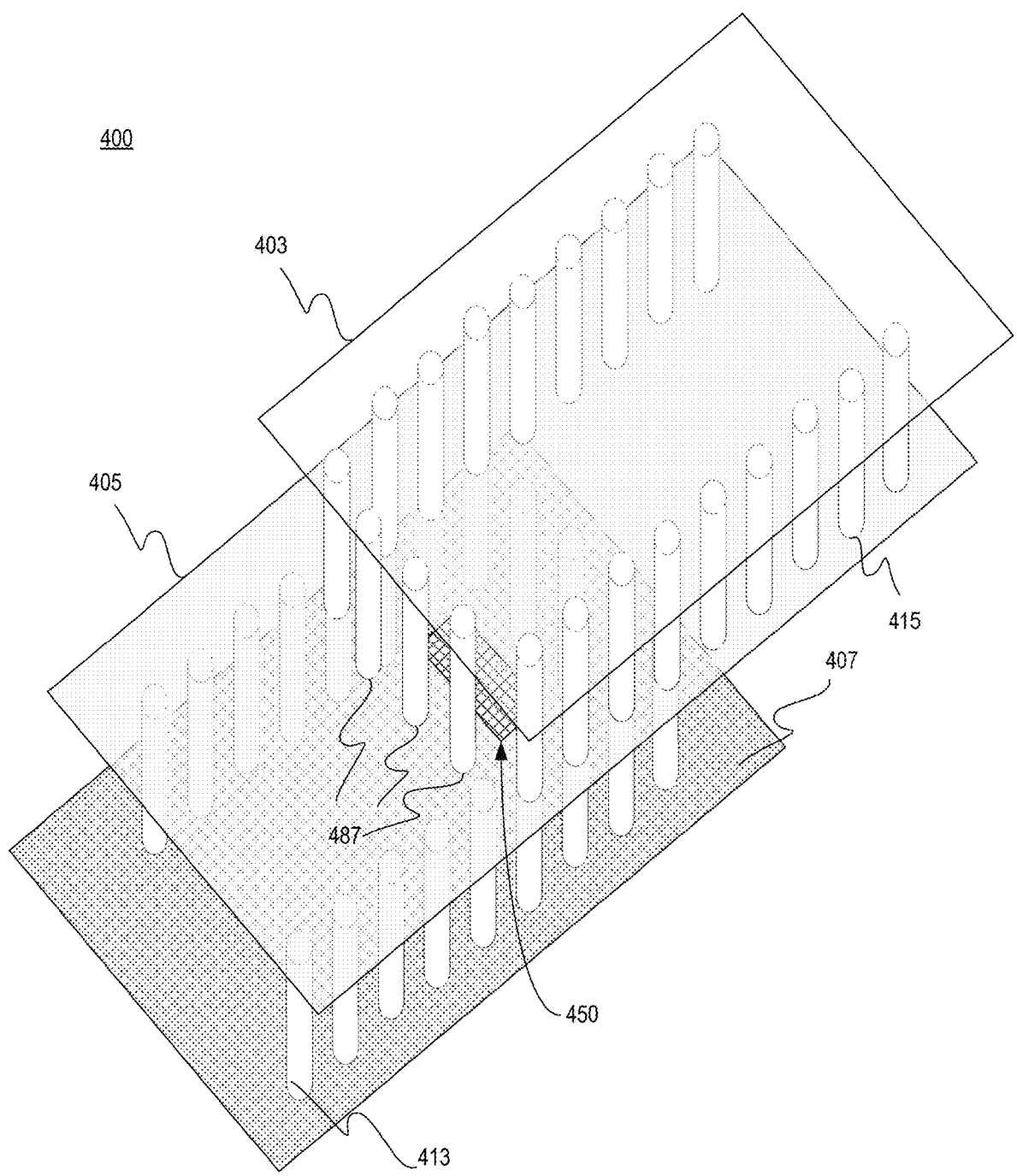
FIG. 3 shows a diagram of a PCB configured for vertically transitioning signals between SIWs in accordance with the present invention.

FIG. 3 sets forth a diagram of an exemplary multilayered PCB configured for vertically transitioning signals between SIWs within a multilayered PCB according to embodiments of the present invention. FIG. 3 illustrates the placement of vias in contact with a ground plane through which a vertical transition is made in an exemplary multilayered PCB (400). Vias (413) of an SIW in a first layer connect between a bottom ground plane (407) and a bottom side of ground plane (405), and vias (415) of an SIW in a second layer connect a top side the ground plane (405) to a top ground plane (403). End wall vias (not labeled) are placed at the end of the SIW in the first layer and end wall vias (487) are placed at the end of the SIW in the second layer, and a transition window (450) or aperture is formed by a rectangular opening in the ground plane (405) between the top layer end wall vias (487) and the bottom layer end wall vias (not labeled).

The network (100) may comprise one or more Local Area Networks (LANs), Wide Area Networks (WANs), Personal Area Networks, mesh networks, cellular networks, internets, intranets, or other networks and combinations thereof. The network (100) may comprise one or more wired connections, wireless connections, or combinations thereof. The network (100) may support many data communications protocols, including for example TCP (Transmission Control Protocol), IP (Internet Protocol), HTTP (HyperText Transfer Protocol), WAP (Wireless Access Protocol), and others as will occur to those of skill in the art.

Figure 4:
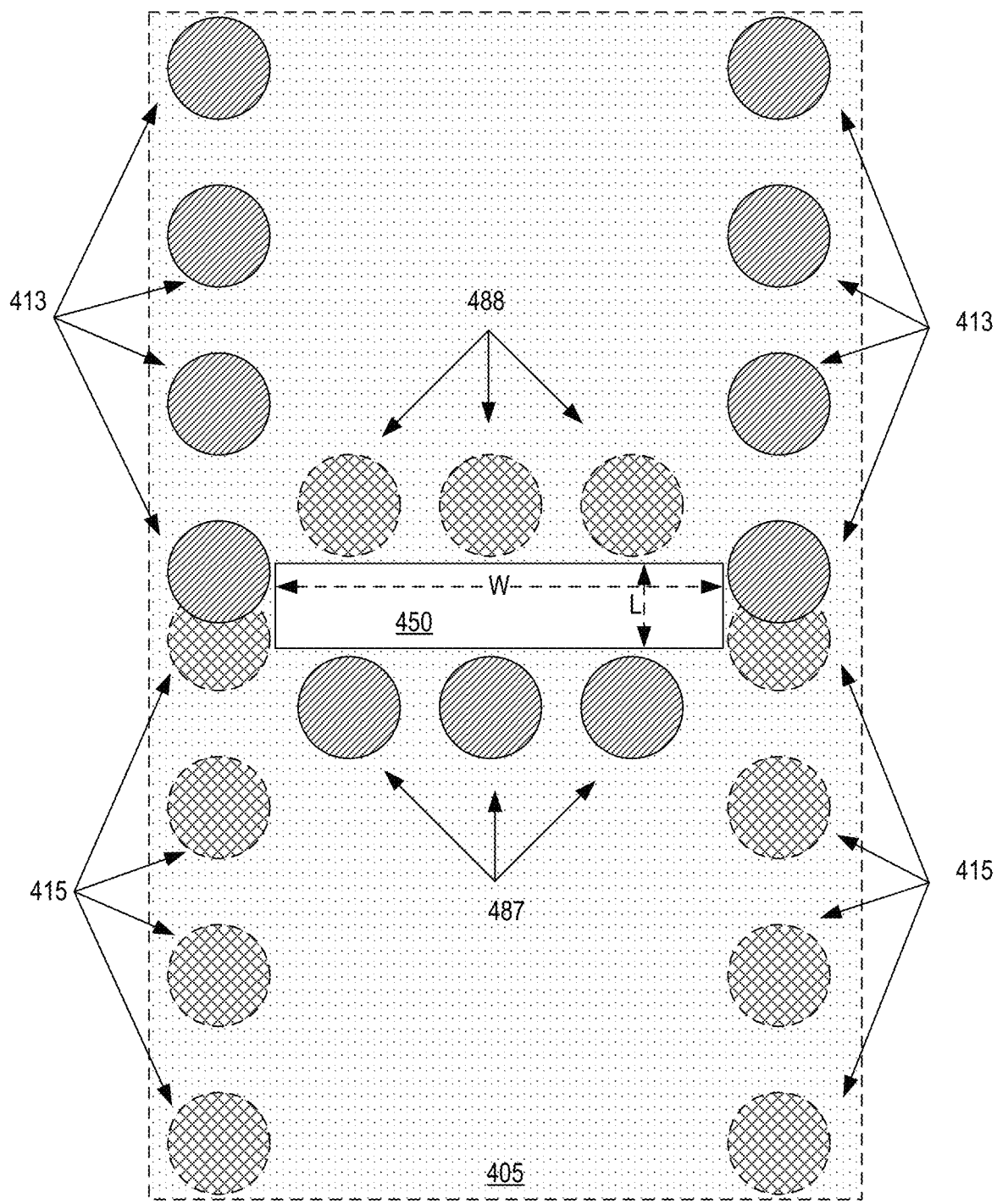
FIG. 4 shows a diagram of a PCB configured for vertically transitioning signals between SIWs in accordance with the present invention.

FIG. 4 sets forth a diagram of an exemplary multilayered PCB configured for vertically transitioning signals between SIWs within a multilayered PCB according to embodiments of the present invention. FIG. 4 illustrates a plane view of the PCB (400) in FIG. 3. FIG. 4 illustrates a ground plane (405) between two layers of a PCB, where side wall vias (415) and end wall vias (488) are in a first layer of the PCB, and side wall vias (413) and end wall vias (487) are in a second layer of the PCB, such that cross-hatched vias (415, 488) connect from underneath the ground plane (405) and single-hatched vias (413, 487) connect from above ground plane (405), as shown in FIG. 3. As shown in FIG. 4, the end wall vias (488) of the first layer and the end wall vias (487) of the second layer define an overlap area of the ground plane (405). The transition window (450) of the ground plane is placed in the area defined, in part, by the end wall vias (478, 488), such that a signal propagating through the first layer is guided through the transition window (450) into the second layer by the end wall vias (487, 488). The transition window (450) has a width, W, that is the width of the waveguide and a length, L, that is selected based on operational frequency, metal and substrate characteristics (e.g., dielectric constant, dissipation factor), and the PCB dimensions (e.g., ground plane thickness). It will be recognized by those of skill in the art that the length of the window can be varied to minimize impedance mismatch in accordance with the characteristics of the system.

For example, two 0.5 inch W-band (75 GHz-110 GHz) SIWs are implemented in the multilayered PCB. The SIWs together comprise three 1.2 mil thick copper ground planes, and a 9 mil thick dielectric in between the ground planes. The dielectric material properties include a dielectric constant of $\varepsilon r=3.5$ and a dissipation factor of $\tan \delta=0.0086$ at 30 GHz. The Djordjevic-Sarkar model may be used to determine the material properties at other frequencies. In this example, each of the SIWs is 0.5 inch in total length. The sidewalls of the SIWs are composed of vias with a 0.1 mm diameter and a center-to-center pitch of PW=0.4 mm. The vias contact top and bottom copper ground planes. All metal in this example is assumed to be copper with a finite conductivity boundary condition imposing a 2 µm surface roughness using the Groisse model. The waveguide width is chosen to be the same as a W-band waveguide scaled by the dielectric material properties, which in this case leads to W=1.357 mm.

In this example, the aperture in the ground plane between the waveguides has a width $W_G$ and a length L. The width, W, is identical to the width of the straight waveguide section in each layer. Ground vias are also placed at the end of the first waveguide in the bottom layer after the opening, and on the opposite side of the opening on the second layer. This is in order to direct wave propagation between the SIWs on both layers.

Figure 7:
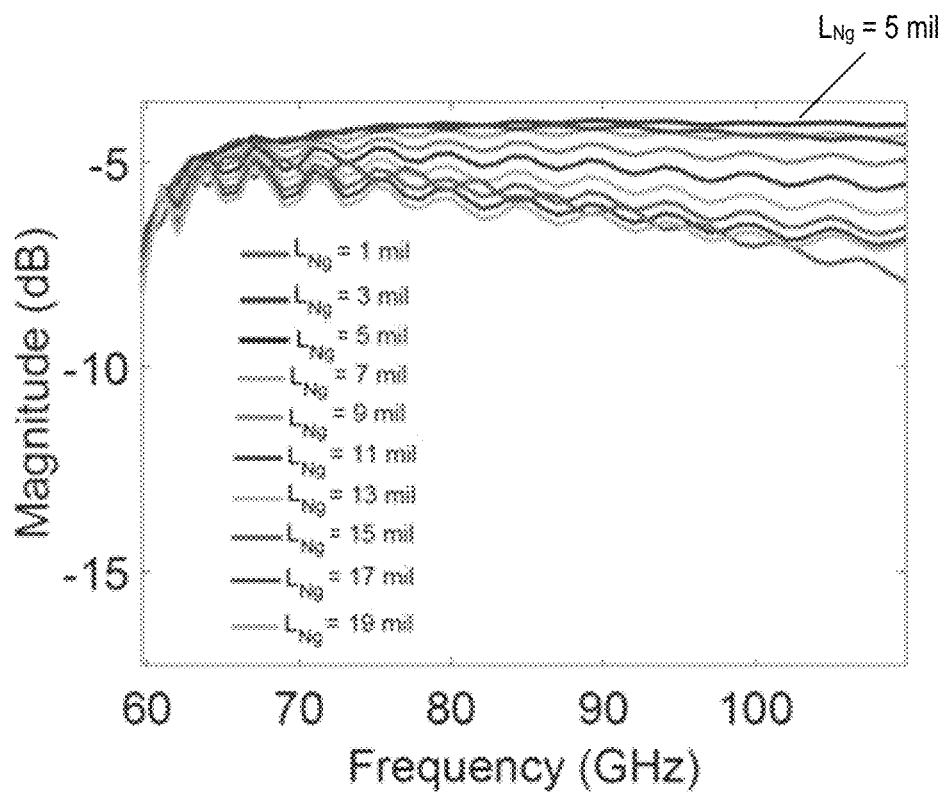
FIG. 7 illustrates signal loss in an exemplary vertical SIW transition as the length of the transition is varied.

FIG. 7 shows the simulated insertion loss, shown as magnitude (dB) relative to the frequency (GHz), of the two 0.5 inch long SIWs on separate layers with the small rectangular opening in the ground plane described above placed between them. The small rectangular opening length, LNg, is varied between 1 mil and 19 mil. For this case, the ideal coupling between layers occurs when using the 5 mil opening length, as shown in FIG. 7. The LNg=5 mil opening length results in a total loss of 4.04 dB at 100 GHz.

Figure 5:
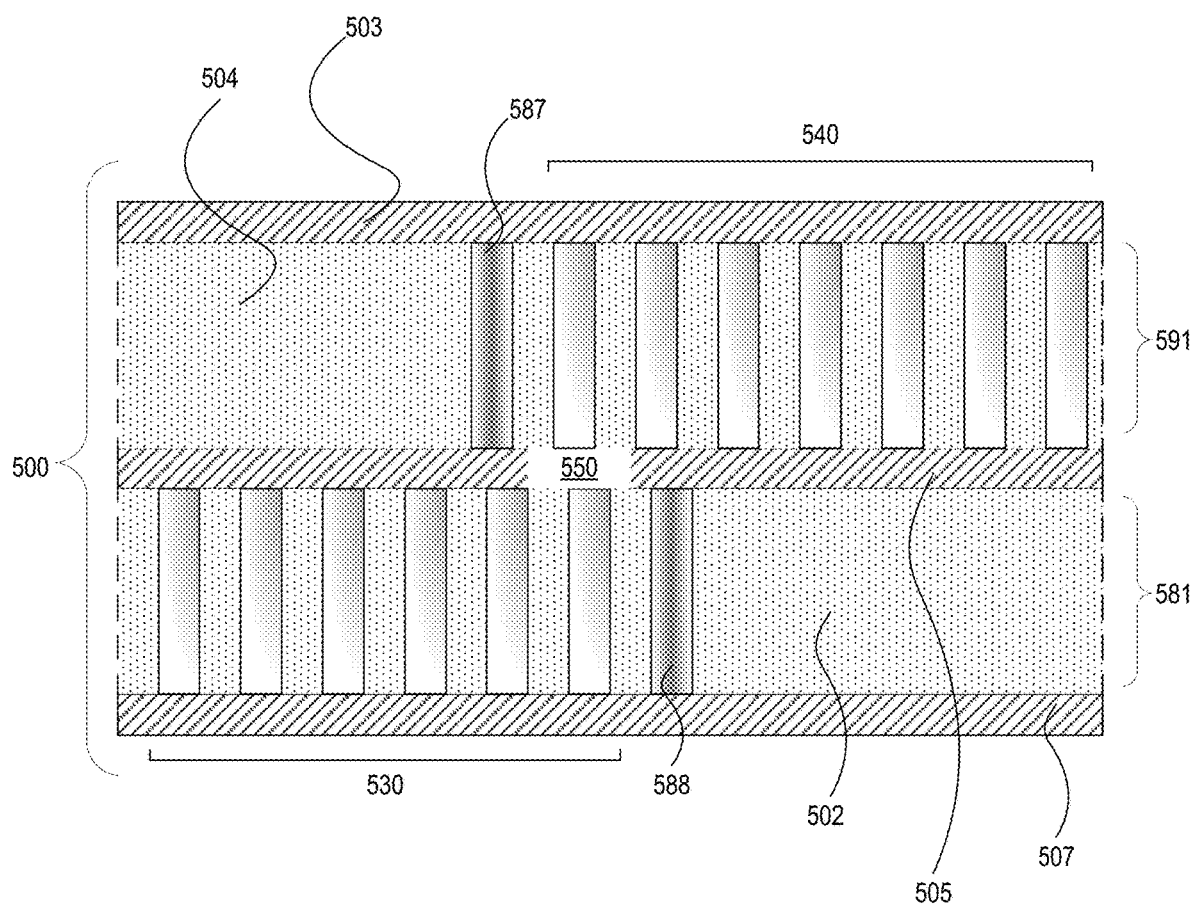
FIG. 5 shows a diagram of a PCB configured for vertically transitioning signals between SIWs in accordance with the present invention.

FIG. 5 sets forth a diagram of an exemplary multilayered PCB configured for vertically transitioning signals between SIWs within a multilayered PCB according to embodiments of the present invention. FIG. 5 is a cross-section view of a multilayered PCB (500) similar to the PCBs (200, 400) in previous examples. The PCB (500) includes a first SIW comprising a dielectric substrate (502), side wall vias (530), and end wall vias (588) sandwiched between a ground plane (505) and a bottom ground plane (507). The PCB (500) includes a second SIW comprising a dielectric substrate (504), side wall vias (540), and end wall vias (587) sandwiched between a ground plane (505) and a top ground plane (503). The ground plane (505) includes an aperture (550) between the end wall vias (588) of the first layer and the end wall vias (587) of the second layer that provides a vertical transition between the first SIW (581) and the second SIW (591) such that a signal propagated through the first SIW (581) is guided through the aperture (550) by the end wall vias (587, 588), and vice versa.

Figure 6:
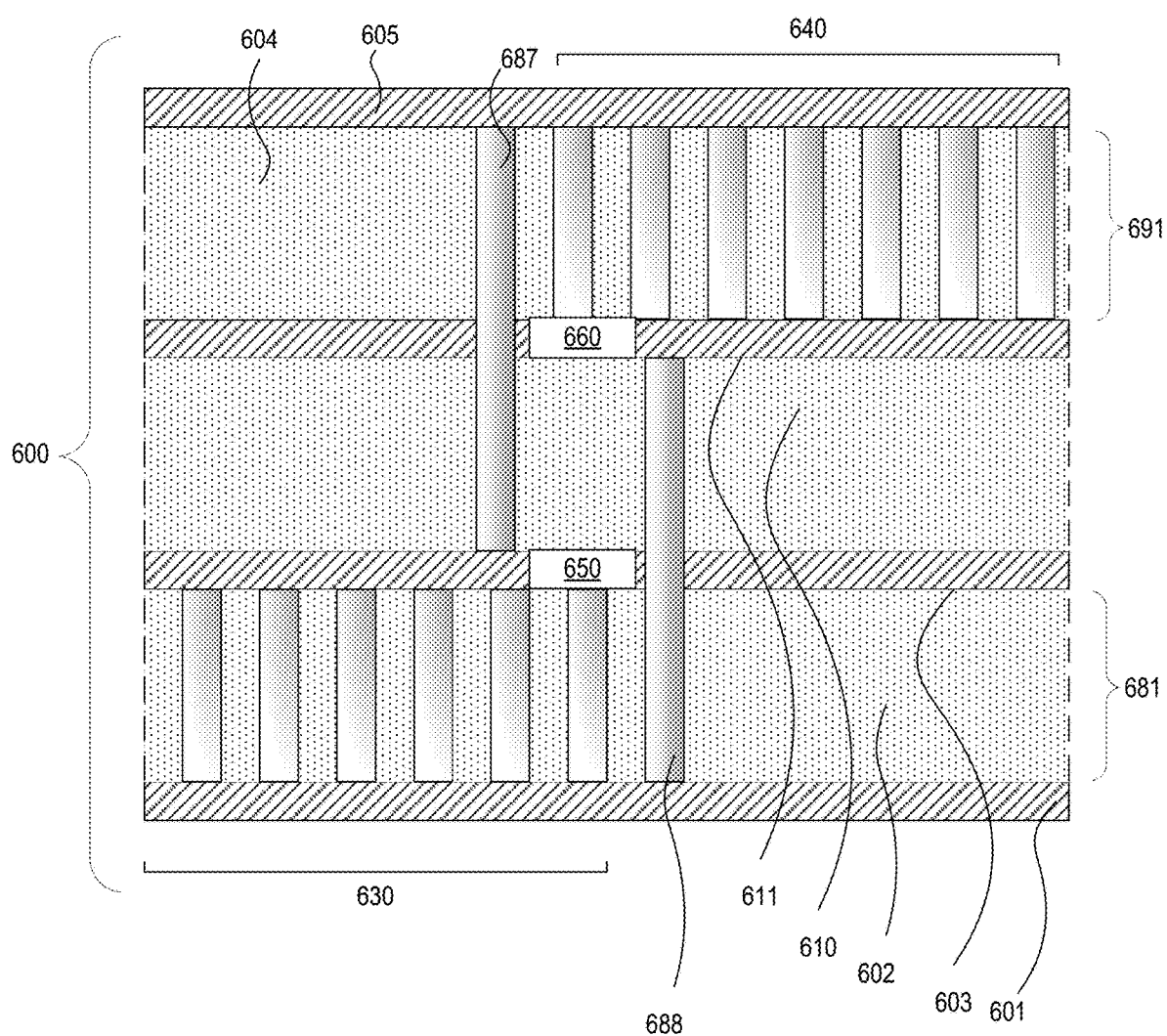
FIG. 6 shows a diagram of a PCB configured for vertically transitioning signals between SIWs in accordance with the present invention.

FIG. 6 sets forth a diagram of an exemplary multilayered PCB configured for vertically transitioning signals between SIWs within a multilayered PCB according to embodiments of the present invention. FIG. 6 is a cross-section view of a multilayered PCB (600) similar to the PCB (500) of FIG. 5 except that the two SIWs are in non-adjacent layers of the PCB (600). The PCB (600) includes a first SIW (681) comprising a dielectric substrate (602), side wall vias (630), and end wall vias (688) sandwiched between a ground plane (603) and a bottom ground plane (601). The PCB (600) includes a second SIW (691) comprising a dielectric substrate (604), side wall vias (640), and end wall vias (687) sandwiched between a ground plane (611) and a top ground plane (605). Here, the end wall vias (688) extend from the bottom ground plane (601) to the ground plane (611), and end wall vias extend from the top ground plane (605) to ground plane (603). The end wall vias (687, 688) extend through a third dielectric layer (610) of the PCB that separates the first SIW (681) and the second SIW (691). The ground planes (603, 611) include respective apertures (650, 660) between the end wall vias (688) and the end wall vias (687) that provide a vertical transition between the first SIW (681) and the second SIW (691) such that a signal propagated through the first SIW (681) is guided through the apertures (650,660) by the end wall vias (687, 688), and vice versa. Accordingly, a vertical transition between non-adjacent layers of the PCB is achieved.

For further explanation, FIG. 8 sets forth a flow chart illustrating an exemplary method for vertically transitioning signals between SIWs within a multilayered PCB according to embodiments of the present invention that includes providing (810) a first substrate integrated waveguide (SIW) implemented in a first layer of the PCB, the first SIW having a first terminal portion, and providing a second SIW implemented in a second layer of the PCB, the second SIW having a second terminal portion that overlaps with the first terminal portion, wherein a first ground plane separates the first SIW and the second SIW. Providing (810) a first substrate integrated waveguide (SIW) implemented in a first layer of the PCB, the first SIW having a first terminal portion, and providing a second SIW implemented in a second layer of the PCB, the second SIW having a second terminal portion that overlaps with the first terminal portion, wherein a first ground plane separates the first SIW and the second SIW may be carried out by providing the first SIW (291) of FIG. 1A including a dielectric substrate (206) and ground vias (215) arranged through the substrate in two tightly-pitched parallel rows, the vias (215) connecting a ground plane (205) to a bottom conductive ground plane (207), between which the dielectric substrate (206) is sandwiched. Together, the ground vias (215), ground plane (205), and ground plane (207) create a waveguide channel to guide a signal that is propagated in the dielectric substrate (206).

Providing (810) a first substrate integrated waveguide (SIW) implemented in a first layer of the PCB, the first SIW having a first terminal portion, and providing a second SIW implemented in a second layer of the PCB, the second SIW having a second terminal portion that overlaps with the first terminal portion, wherein a first ground plane separates the first SIW and the second SIW may be further carried out by providing the second SIW of FIG. 1A including a dielectric substrate (204) and ground vias (213) arranged through the substrate in two tightly-pitched parallel rows, the vias (213) connecting the ground plane (205) to a top conductive ground plane (203), between which the dielectric substrate (204) is sandwiched. Together, the ground vias (213), ground plane (205), and ground plane (203) create a waveguide channel to guide a signal that is propagated in the dielectric substrate (204).

The method of FIG. 8 further includes providing (820) a vertical transition comprising an aperture the first ground plane that is disposed an area defined by the overlap of the first terminal portion and the second terminal portion. Providing (820) a vertical transition comprising an aperture the first ground plane that is disposed an area defined by the overlap of the first terminal portion and the second terminal portion may be carried out by forming a window (250) of FIG. 1B in the ground plane (205) at an area where the vias (215) of the first SIW (281) and the vias (213) of the second SIW (291) overlap. An end wall of vias (288), disposed perpendicular to and between the parallel rows of vias (215), is placed at the end of the parallel rows of vias (215) creating a signal propagation boundary of the first SIW (281). The window (250) in the ground plane (205) is provided proximate the end wall of vias (288). Another end wall of vias (287), disposed perpendicular to and between the parallel rows of vias (213), is placed at the end of the parallel rows of vias (213) creating a signal propagation boundary of the second SIW (291). The window (250) in the ground plane (205) is provided proximate the end wall of vias (287).

The method of FIG. 8 further includes propagating (830) a signal in the first SIW. Propagating (830) a signal in the first SIW of FIG. 1A may be carried out by, for example, inputting a high speed signal in the first SIW (281) that is carried through the dielectric substrate (206), and which is bounded by ground vias (213, 215), ground plane (205) and bottom ground plane (207).

The method of FIG. 8 further includes receiving (840) the signal in the second SIW through the aperture. Receiving (840) the signal in the second SIW of FIG. 1A through the aperture may be carried out by receiving a signal that was propagated through the first SIW (281) in the first dielectric substrate (206), then transitioned vertically through the window (250) of FIG. 1B in the ground plane with end wall vias (287, 288) as guides, and then propagated through the second dielectric substrate (204) of the second SIW.

In view of the explanations set forth above, readers will recognize that the benefits of vertically transitioning signals between SIWs within a multilayered PCB according to embodiments of the present invention include:
- Signals that can be propagated between waveguides that are integrated in different layers of a multilayered PCB;
- Vertical signal transitions between SIWs in a multilayered PCB can be achieved with performance characteristics better than those of conventional striplines
- Vertically transitioning signals between SIWs is advantageous in high speed signaling applications such as high-speed buses.

Exemplary embodiments of the present invention are described largely in the context of a fully functional computer system for vertically transitioning signals between SIWs within a multilayered PCB. Readers of skill in the art will recognize, however, that the present invention also may be embodied in a computer program product disposed upon computer readable storage media for use with any suitable data processing system. Such computer readable storage media may be any storage medium for machine-readable information, including magnetic media, optical media, or other suitable media. Examples of such media include magnetic disks in hard drives or diskettes, compact disks for optical drives, magnetic tape, and others as will occur to those of skill in the art. Persons skilled in the art will immediately recognize that any computer system having suitable programming means will be capable of executing the steps of the method of the invention as embodied in a computer program product. Persons skilled in the art will recognize also that, although some of the exemplary embodiments described in this specification are oriented to software installed and executing on computer hardware, nevertheless, alternative embodiments implemented as firmware or as hardware are well within the scope of the present invention.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk™, C++or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. An apparatus configured for vertically transitioning signals between substrate integrated waveguides within a multilayered printed circuit board (PCB), comprising:
 a first substrate integrated waveguide (SIW) implemented in a first layer of the PCB, the first SIW having a first terminal portion;
 a second SIW implemented in a second layer of the PCB, the second SIW having a second terminal portion that overlaps with the first terminal portion;
 a first ground plane separating the first SIW and the second SIW; and
 a vertical transition comprising an aperture in the first ground plane that is disposed in an area defined by the overlap of the first terminal portion and the second terminal portion, wherein the first SIW includes a first set of ground vias crossing the first SIW adjacent to a first side of the aperture and the second SIW includes a second set of ground vias crossing the second SIW adjacent to a second side of the aperture, such that the first set of ground vias and the second set of ground vias guide a signal through the aperture from the first layer to the second layer, and wherein the first layer of the PCB and the second layer of the PCB are separated by one or more additional layers including a second ground plane having a second aperture corresponding to the aperture of the first ground plane, and wherein the first set of ground vias extends from a bottom of the first ground plane of the first SIW to the second ground plane, and wherein the second set of vias extend from the first ground plane to a top of the second ground plane of the second SIW.

2. The apparatus of claim 1,
wherein the first SIW comprises, disposed between the first ground plane and the second ground plane:
   a first dielectric layer,
   first side walls of periodic vias connecting the first ground plane and the second ground plane, and
   the first set of ground vias, connecting the first ground plane and the second ground plane, disposed perpendicular to and between the first side walls at the first terminal portion; and
wherein the second SIW comprises, disposed between the first ground plane and a third ground plane:
   a second dielectric layer,
   second side walls of periodic vias connecting the first ground plane and the third ground plane, and
   the second set of ground vias, connecting the first ground plane and the third ground plane, disposed perpendicular to and between the second side walls at the second terminal portion.

3. The apparatus of claim 2, wherein the first set of ground vias and the second set of ground vias at least partially define the overlap of the first terminal portion and the second terminal portion such that the aperture in the first ground plane is formed between connection points of the first set of ground vias and the second set of ground vias to the first ground plane.

4. The apparatus of claim 1, wherein a width of the aperture is equal to a width of the waveguide of the first SIW and the second SIW, and wherein a length of the aperture is determined based on operational frequency, substrate material characteristics, and a thickness of the first ground plane, wherein the length of the aperture is oriented parallel to a direction of the overlap of the first terminal portion and the second terminal portion, and wherein the width of the aperture is oriented perpendicular to the direction of the overlap of the first terminal portion and the second terminal portion.

5. The apparatus of claim 1, wherein the apparatus is a high-speed signaling bus channel.

6. A method of vertically transitioning a signal between a first substrate integrated waveguide (SIW) and a second SIW within a multilayered printed circuit board (PCB), comprising:
   providing the first SIW implemented in a first layer of the PCB, the first SIW having a first terminal portion, and providing the second SIW implemented in a second layer of the PCB, the second SIW having a second terminal portion that overlaps with the first terminal portion, wherein a first ground plane separates the first SIW and the second SIW;
   providing a vertical transition comprising an aperture in the first ground plane that is disposed in an area defined by the overlap of the first terminal portion and the second terminal portion, wherein the first SIW includes a first set of ground vias crossing the first SIW adjacent to a first side of the aperture and the second SIW includes a second set of ground vias crossing the second SIW adjacent to a second side of the aperture, such that the first set of ground vias and the second set of ground vias guide a signal through the aperture from the first layer to the second layer, and wherein the first layer of the PCB and the second layer of the PCB are separated by one or more additional layers including a second ground plane having a second aperture corresponding to the aperture of the first ground plane, and wherein the first set of ground vias extends from a bottom of the first ground plane of the first SIW to the second ground plane, and wherein the second set of vias extend from the first ground plane to a top of the second ground plane of the second SIW;
   propagating a signal in the first SIW; and
   receiving the signal in the second SIW through the apertures.

7. The method of claim 6, wherein a width of the aperture is equal to a width of the waveguide of the first SIW and the second SIW, and wherein a length of the aperture is determined based on operational frequency, substrate material characteristics, and a thickness of the first ground plane, wherein the length of the aperture is oriented parallel to a direction of the overlap of the first terminal portion and the second terminal portion, and wherein the width of the aperture is oriented perpendicular to the direction of the overlap of the first terminal portion and the second terminal portion.

8. The method of claim 6, wherein the first SIW and the second SIW serve as a high speed signaling bus channel within which a high speed signal propagates.

9. The method of claim 6,
wherein providing the first SIW in the first layer of the PCB includes placing between the first ground plane and the second ground plane:
   a first dielectric layer,
   first side walls of periodic vias connecting the first ground plane and the second ground plane, and
   the first set of ground vias, connecting the first ground plane and the second ground plane, disposed perpendicular to and between the first side walls at the first terminal portion; and
wherein providing the second SIW in the second layer of the PCB includes placing between the first ground plane and a third ground plane:
   a second dielectric layer,
   second side walls of periodic vias connecting the first ground plane and the third ground plane, and
   the second set of ground vias, connecting the first ground plane and the third ground plane, disposed perpendicular to and between the second side walls at the second terminal portion.

10. The method of claim 9, wherein the first set of ground vias and the second set of ground vias at least partially define the overlap of the first terminal portion and the second terminal portion such that the aperture in the first ground plane is formed between connection points of the first set of ground vias and the second set of ground vias to the first ground plane.

11. A multilayered printed circuit board (PCB) comprising:
   a first substrate integrated waveguide (SIW) implemented in a first layer of the PCB, the first SIW having a first terminal portion;
   a second SIW implemented in a second layer of the PCB, the second SIW having a second terminal portion that overlaps with the first terminal portion;
   a first ground plane separating the first SIW and the second SIW; and
   a vertical transition comprising in an aperture the first ground plane that is disposed in an area defined by the overlap of the first terminal portion and the second terminal portion, wherein the first SIW includes a first set of ground vias crossing the first SIW adjacent to a first side of the aperture and the second SIW includes a second set of ground vias crossing the second SIW adjacent to a second side of the aperture, such that the first set of ground vias and the second set of ground vias guide a signal through the aperture from the first layer to the second layer, and wherein the first layer of the PCB and the second layer of the PCB are separated by one or more additional layers including a second ground plane having a second aperture corresponding to the aperture of the first ground plane, and wherein the first set of ground vias extends from a bottom of the first ground plane of the first SIW to the second ground plane, and wherein the second set of vias extend from the first ground plane to a top of the second ground plane of the second SIW.

12. The PCB of claim 11, wherein a width of the aperture is equal to a width of the waveguide of the first SIW and the second SIW, and wherein a length of the aperture is determined based on operational frequency, substrate material characteristics, and a thickness of the first ground plane, wherein the length of the aperture is oriented parallel to a direction of the overlap of the first terminal portion and the second terminal portion, and wherein the width of the aperture is oriented perpendicular to the direction of the overlap of the first terminal portion and the second terminal portion.

13. The PCB of claim 11,
wherein the first SIW comprises, disposed between the first ground plane and the second ground plane:
a first dielectric layer,
first side walls of periodic vias connecting the first ground plane and the second ground plane, and
the first set of ground vias, connecting the first ground plane and the second ground plane, disposed perpendicular to and between the first side walls at the first terminal portion; and
wherein the second SIW comprises, disposed between the first ground plane and a third ground plane:
a second dielectric layer,
second side walls of periodic vias connecting the first ground plane and the third ground plane, and
the second set of ground vias, connecting the first ground plane and the third ground plane, disposed perpendicular to and between the second side walls at the second terminal portion.

14. The PCB of claim 13, wherein the first set of ground vias and the second set of ground vias at least partially define the overlap of the first terminal portion and the second terminal portion such that the aperture in the first ground plane is formed between connection points of the first set of ground vias and the second set of ground vias to the first ground plane.

* * * * *